United States Patent [19]

Nagasawa

[11] Patent Number: 5,444,403

[45] Date of Patent: Aug. 22, 1995

[54] DUTY DISCRIMINATING CIRCUIT

[75] Inventor: Makoto Nagasawa, Ageo, Japan

[73] Assignee: Kabushiki Kaisha Toshiba, Kawasaki, Japan

[21] Appl. No.: 171,634

[22] Filed: Dec. 22, 1993

[30] Foreign Application Priority Data

Dec. 22, 1992 [JP] Japan .................. 4-342809

[51] Int. Cl.6 ............................................. H03K 5/26
[52] U.S. Cl. .................................. 327/172; 327/175; 327/31; 327/36; 327/37
[58] Field of Search ................ 307/234; 328/111, 112; 377/20, 39; 360/14.2, 14.3, 46, 51

[56] References Cited

U.S. PATENT DOCUMENTS

| | | | |
|---|---|---|---|
| 3,961,271 | 6/1976 | Zlydak et al. | 307/234 |
| 4,008,488 | 2/1977 | Osborne | 360/51 |
| 4,756,013 | 7/1988 | Van Velohuizen | 377/39 |
| 4,841,932 | 6/1989 | Hansen et al. | 377/20 |
| 5,210,444 | 5/1993 | Johnson | 307/234 |

Primary Examiner—Timothy P. Callahan
Assistant Examiner—T. Lam
Attorney, Agent, or Firm—Oblon, Spivak, McClelland, Maier & Neustadt

[57] ABSTRACT

A duty ratio discriminating circuit for discriminating a ratio of a high-level precedent portion to one period of an information signal whose level varies periodically, on the basis of threshold values. A sequencer outputs a shift signal to obtain a first threshold level, by detecting the precedent portion of the information signal to output a sampling signal. A subsequent portion of the information signal is detected to output a lath signal, and both the precedent and subsequent portions of the information signal are detected to output a reset signal. A counter circuit detects a time period of the precedent portion of the information signal by counting a number of reference clock signals to obtain count data. A shift circuit shifts the count data. A discriminating circuit obtains a discriminate point by comparing a time period of the subsequent portion of the information signal with a second threshold value corresponding to the count data shifted by the shift circuit. An output circuit outputs a duty ratio discriminate signal on the basis of a relationship between the discriminate point output by the discrimination circuit and the subsequent portion time data.

6 Claims, 8 Drawing Sheets

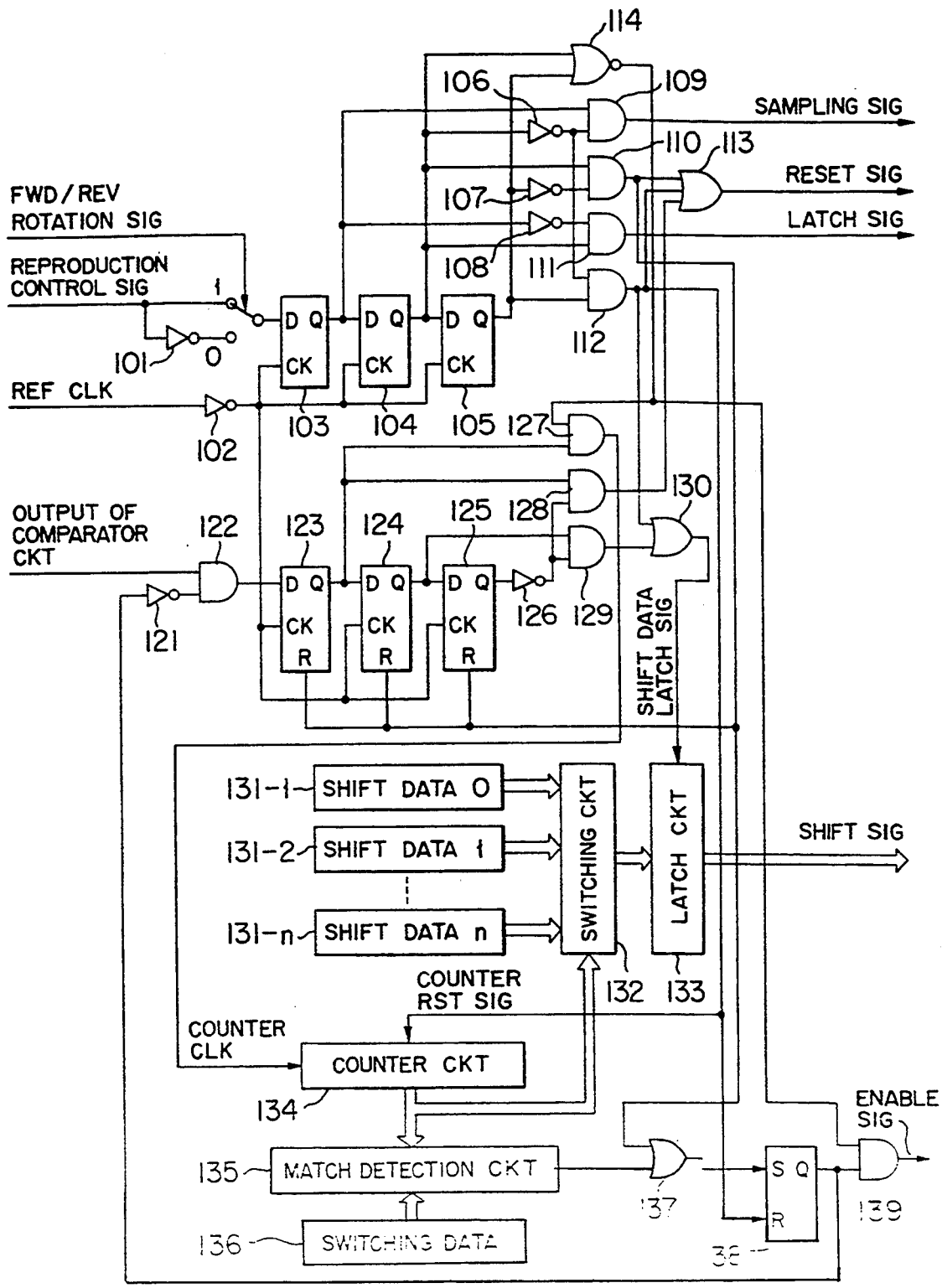
F I G. 2

DUTY DISCRIMINATING CIRCUIT

BACKGROUND OF THE INVENTION

1. Field of the Invention

The present invention relates to a duty discriminating circuit, and more specifically to a circuit for discriminating a duty (a rate of a precedent high-level portion to one period of an input signal whose level changes periodically) on the basis of a threshold level.

2. Description of the Prior Art

A conventional duty discriminating circuit will be described hereinbelow by taking the case of the one used for a household VTE (Video Tape Recorder).

In household VTRs based on the VHS standard, there exists cases where various codes such as index codes, address codes, etc. represented by bit information are recorded on a video tape. As a method of recording the bit information on the video tape, a method of using a control signal recorded on the video tape for phase matching has been so far known. In this method, the recorded one-bit information or data "0" and "1" are represented by two one-cycle pulses of two different duties, respectively. In more detail, in usual, the duty of "0" is determined to be 80% and the duty of "1" is determined to be 27.5%. Further, whenever these bit information or data are reproduced, the "0" or "1" of the reproduced signal has been so far discriminated by comparing the duty of the reproduced control signal with a threshold value (described later) with the use of a duty discriminating circuit.

In more detail, in the conventional duty discriminating circuit, a counter is activated in response to a rise edge of a signal to be discriminated; the precedent portion of the signal is counted; a rate of the counted number of the precedent portion to a count number corresponding to one period of the signal is determined to be a duty of the signal; and the determined rate is compared with a threshold value of 50%.

In the conventional duty discriminating circuit, therefore, it is ideal that the threshold value is determined to be an intermediate value between the two duties used to record the hit information as follows:

(27.5+60)/2−43.5%

Furthermore, in the conventional duty discriminating circuit, when the video tape is rotated in the reverse direction, since the precedent portion and the subsequent portion are reversed with respect to each other, the duties of the reproduced control signal become 72.5% and 40%, respectively, so that the ideal threshold value changes as follows:

(27.5+40)/2=56.25%

As described above, since the threshold value (i.e., 50%) adopted in the conventional duty discriminating circuit deviates largely from an ideal value, when the video tape is fed at a high speed, there exists a problem in that an erroneous discrimination occurs, in particular when the reproducibility of the reproduced control signal is low.

Further, in the present VTR, although the duties of 27.5% and 60% are adopted in general, since there exists a possibility that other duties will be adopted in the future, it is preferable to use a duty discriminating circuit by which a threshold value other than 50% can be adopted.

To overcome the above-mentioned problem, Japanese Laid-open (Kokai) Patent Application No. 1-282919 discloses a duty discriminating circuit which can discriminate the duties on the basis of and given threshold values by using two different clock signals separately in the precedent high-level portion and the subsequent low-level portion. In this prior art duty discriminating circuit, however, since complicated calculations are required for the duty discrimination, there exists another problem in that the circuit scale is inevitably increased.

SUMMARY OF THE INVENTION

Accordingly, it is the object of the present invention to provide a duty discriminating circuit which can set any optimum threshold value according to the duty of an information signal, An spite of a simple circuit configuration.

According to the present invention, there is provided a duty discriminating circuit for discriminating a duty of an information signal whose level varies periodically, on the basis of a threshold value, comprising:

a counter circuit for detecting a time period of a precedent portion and subsequent portion of the information signal by counting the number of reference clock signals;

a shift circuit for shifting the precedent portion time data obtained by said counter circuit;

a discriminating circuit for obtaining a discriminate point by comparing a time period of the subsequent portion of the information signal with a virtual threshold value corresponding to the time data shifted by said shift circuit; and an output circuit for outputting a duty discriminate signal on the basis of a relationship between the discriminate point outputted by said discriminating circuit and the subsequent portion time data.

According to another aspect of the invention, there is provided a duty discriminating circuit for discriminating a duty of an information signal whose level varies periodically, on the basis of a threshold value, comprising:

a sequencer for outputting a shift signal to obtain an optimum threshold level, by detecting a precedent portion of the information signal to output a sampling signal, detecting a subsequent portion of the information signal to output a latch signal, and detecting both portions of the information signal to output a reset signal, a counter circuit reset in response to the reset signal, for counting reference clock signals;

a latch circuit for latching count data counted as a precedent portion time period data by said counter circuit in response to the latch signal;

a shift circuit for shifting the count data latched by said latch circuit by $(2^{-n})$ times (where n denotes zero or a natural number) in bit unit on the basis of the shift signal outputted by said sequencer, and for outputting the shifted counted data;

a comparator circuit for comparing the count data outputted by said counter circuit with a virtual threshold value corresponding to the shift data outputted by said shift circuit and for outputting a comparison result signal when the count data is larger than the shifted count data; and an output circuit for outputting the comparison result signal as a discriminate result signal on the basis of a level of the information signal and the sampling signal.

A duty discriminating circuit for discriminating a duty of an information signal whose level varies periodically, on the basis of a threshold value, comprising:

a sequencer for outputting a shift signal, by detecting a precedent portion of the information signal to output a sampling signal, detecting a subsequent portion of the information signal to output a latch signal, and detecting both portions of the information signal to output a reset signal;

a counter circuit reset in response to the reset signal, for counting reference clock signals;

a latch circuit for latching count data counted by said counter circuit as a precedent portion time period data in response to the latch signal;

a comparator circuit for comparing the count data outputted by said counter circuit with the latch data outputted by said latch circuit and for outputting a comparison result signal when the count data is larger than the shifted count data; and an output circuit for outputting the comparison result signal as a discriminate result signal on the basis of a level of the information signal and the sampling signal.

To achieve the above-mentioned object, in a duty discriminating circuit according to the present invention, a time period of a precedent portion of the information signal whose level varies periodically is obtained by counting the number of reference clock signals; the precedent portion time data obtained by the counter circuit is shifted by a shift circuit; a discriminate point is obtained by comparing a time period of a subsequent portion of the information signal with a virtual threshold value corresponding to the shifted time data; and the duty discrimination is determined on the basis of a relationship between the discriminate point and the subsequent portion time data.

In the duty discriminating circuit according to the present invention, it is possible to discriminate the duty of the information signal, without the need of any complicated calculations.

BRIEF DESCRIPTION OF THE DRAWINGS

In the attached drawings:

FIG. 2 is a block diagram showing a detailed configuration of a sequencer shown in FIG. 1;

DETAILED DESCRIPTION OF THE PREFERRED EMBODIMENTS

The first embodiment of the duty discriminating circuit according to the present invention will be described hereinbelow with reference to FIG. 1.

Figure 1:
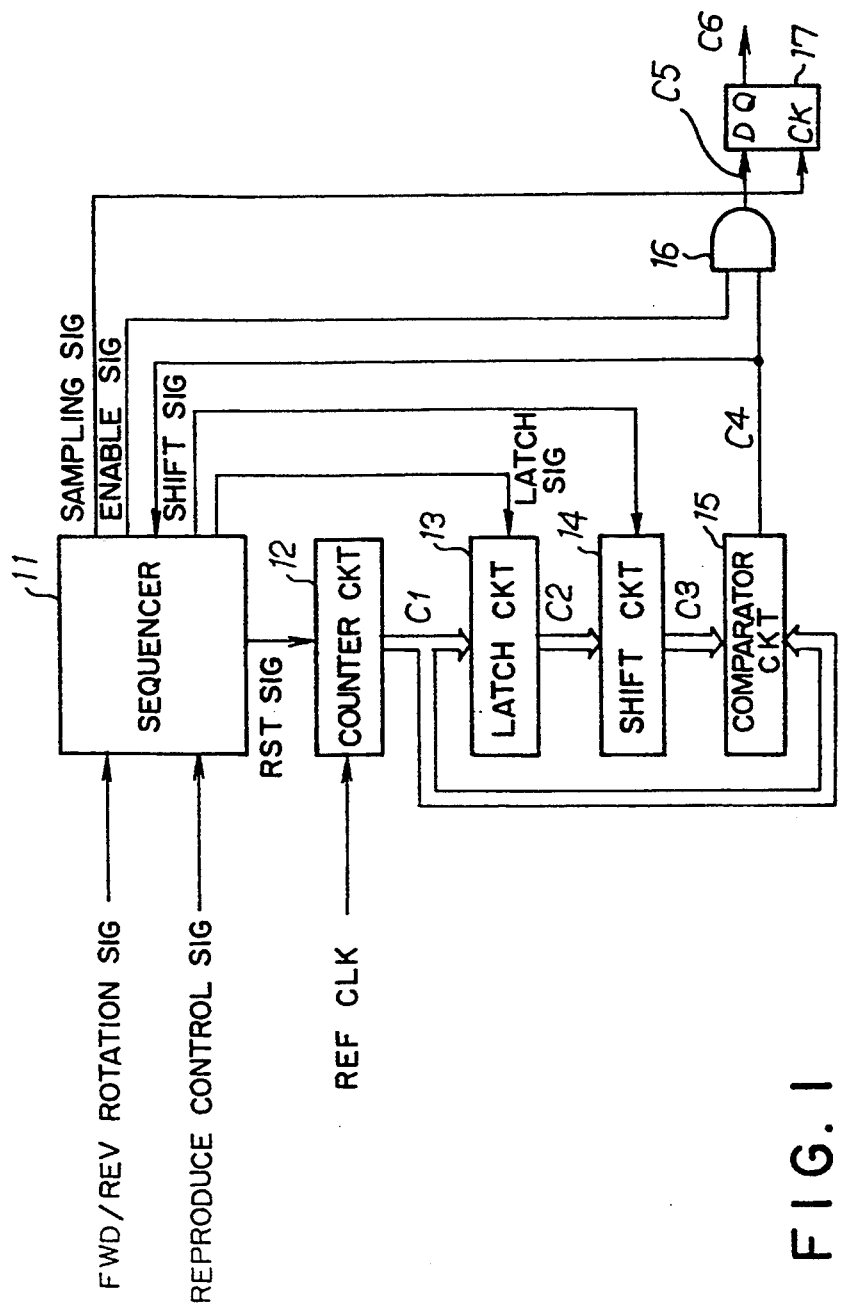
FIG. 1 is a block diagram showing a first embodiment of the duty discriminating circuit according to the present invention.

In FIG. 1, the duty discriminating circuit comprises a signal sequencer 11, a counter circuit 12, a latch circuit 13, a shift circuit 14, a comparator circuit 15, an AND circuit 18 and a D type flip-flop circuit 17.

The signal sequencer 11 receives a reproduce control signal and a forward/reverse rotation signal as inputs. Further, when detecting a rise edge of the reproduce control signal, the signal sequencer 11 outputs a sampling signal and a reset signal, and further sets an enable signal to a low level. Further, when detecting a fall edge of the reproduced control signal, the signal sequencer 11 outputs the reset signal and a latch signal in the case where the forward/reverse rotation signal indicates the forward rotation (e.g. a high level), and a second shift signal together with the reset signal and the latch signal in the case where the forward/reverse rotation signal indicates the reverse rotation (e.g., a low level). In addition, the signal sequencer 11 receives a signal $C_4$ indicative of a comparison result from the comparator circuit 15 (described later). When the inputted signal $C_4$ is at the high level (the forward rotation), the signal sequencer 11 outputs the reset signal and the shift signal. This shaft signal becomes a first shift signal when the forward/reverse rotation signal is at the high level and a second shift signal when at the low level. Further, when the signal $C_4$ is at the high level and the reproduced control signal is at the low level, the signal sequencer 11 sets the enable signal to the high level.

The counter circuit 12 counts the number of reference clock signals given by a reference clock forming circuit (not shown) and outputs a count value $C_1$. Further, the counter circuit 12 resets the count value $C_1$ in response to the reset signal applied by the signal sequencer 11. Therefore, the counter circuit 12 can measure a time elapsed after being reset.

The latch circuit 13 latches the count value $C_1$ outputted by the counter circuit 12 in response to the latch signal supplied by the signal sequencer 11.

The shift circuit 14 receives a latch data $C_2$ applied by the latch circuit 13. When the first shift signal is inputted by the signal sequencer 11, the shift circuit 14 shifts this inputted latch data $C_2$ in the reduction direction that the output value can be reduced down to $\frac{1}{4}$ of the latch data $C_2$ and outputs the reduced latch data $C_3$. Further, when the second shift signal is given by the signal sequencer 11, the shift circuit 14 shifts this inputted latch data $C_2$ in the reduction direction that the output value can be reduced down to $\frac{1}{2}$ of the latch data $C_2$ and outputs the reduced latch data $C_3$.

The comparator circuit 15 receives the count value $C_1$ outputted by the counter circuit 12 and the latch value $C_3$ outputted by the shift circuit 14 to compare these two values $C_1$ and $C_3$. The comparator circuit 15 sets an output signal $C_4$ to the low level when $C_1 < C_3$ but to the high level when the count value $C_1$ increases up to the condition of $C_1 \geq C_3$.

The AND circuit 16 outputs the signal $C_4$ inputted by the comparison circuit 15 as it is as a discriminate threshold signal $C_5$ when the enable signal given by the signal sequencer 11 is at the high level, but the discriminate threshold signal $C_5$ fixed to the low level when the enable signal is at the low level.

The data flip-flop circuit 17 outputs the discriminate threshold signal $C_5$ supplied by the AND circuit 18 as a duty discriminate result signal $C_8$ when the sampling signal is given by the signal sequencer 11.

FIG. 2 is a circuit diagram showing a detailed circuit configuration of the sequencer 11 shown in FIG. 1. In the drawing, three-stage D flip-flop circuits 103, 104 and 105 are connected in series. A reproduction control signal or an inversion signal thereof (inverted by an inverter 101) selected by the forward/reverse rotation signal is given to a D input terminal of the first-stage flip-flop circuit 103. Further, also inputted to the D input terminal of the first-stage flip-flop circuit 103. Further, the reference clock signal inverted by an inverter 102 is supplied to clock input terminals of these D flip-flop circuits 103, 104 and 105, respectively.

The Q output signal of the flip-flop circuit 103 is applied to one input terminal of an AND gate 109 and to one input terminal of an AND gate 111 via an inverter 108, The Q output signal of the flip-flop circuit 10 is applied to the other input terminal of an AND gate 109 via an inverter 106, to one input terminal of an AND gate 110, to the other input terminal of the AND gate 111, and to one input terminal of a NOR gate 114, respectively. Further, the Q output signal of the flip-flop circuit 105 is applied to the other input terminal of the NOR gate 114, to the other input terminal of the AND gate 110 via an inverter. 107, and to one input terminal of an AND gate 112, respectively. The sampling signal is outputted by the AND gate 109, and the latch signal is outputted by the AND gate 111.

The reference clock signal is also applied to other series-connected three-stage D flip-flop circuits 123, 124 and 125. The reset signal (the output signal) of the AND gate 110 is applied to the reset input terminals of these flip-flop circuits 123, 124 and 125. The output signal of the comparison circuit is-applied to the D input terminal of the first-stage flip-flip 123 via an AND gate 122. The output signal of the flip-flop circuit 123 is applied to one input terminal of an AND gate 127 and to one input terminal of an AND gate 128, respectively. The output signal of the flip-flop circuit 124 is applied to one input terminal of an AND gate 129. The output signal of the flip-flop circuit 125 is inverted by an inverter 126 and then applied to the other input terminal of an AND gate 128 and to the other input terminal of an AND gate 129, respectively. The output signals of the AND gates 128, 110 and 112 are given to an OR gate 113 to output a reset signal. The output signal of the AND gate 127 is given to a counter circuit 134 as a counter clock, and the output signals of the AND gates 112 and 129 are both applied to an OR gate 130 to obtain a shift data latch signal, which is applied to a latch circuit 133.

Storing sections 131-1 to 131-n are incorporated to store any given shift data O to n. Any one of the data read out of these storing sections is selected by a switching circuit 132, and then applied to the latch circuit 133, from which a shift signal having various reduction factors can be obtained.

The above-mentioned latch signal is also given to a counter circuit 134 as a counter reset signal, and count data outputted by the counter circuit 134 are given to the switching circuit 132 and a match detection circuit 13. The match detection circuit 135 compares the count data outputted by the counter circuit 134 with a switching threshold value obtained by a switching data storing section 136. When both match each other, the match detection circuit 134 outputs a match output signal to a set input terminal of a RS flip-flop circuit 138 via an OR Eats 137. At the other input terminal of the OR gate 137, the output signal of the AND Eats 110 is given. Further, the output signal of the AND gate 112 is applied to a reset input terminal of the RS flip-flop circuit 138. The output signal of the R8 flip-flop circuit 138 is applied to one input terminal of the AND gate 139 and is inverted by an inverter 121 and then given to an input terminal of an AND gate 122. At the other side of the AND gate 139, the output signal of the OR gate 113 is given, so that the AND gate 139 outputs an enable signal.

Figure 3:
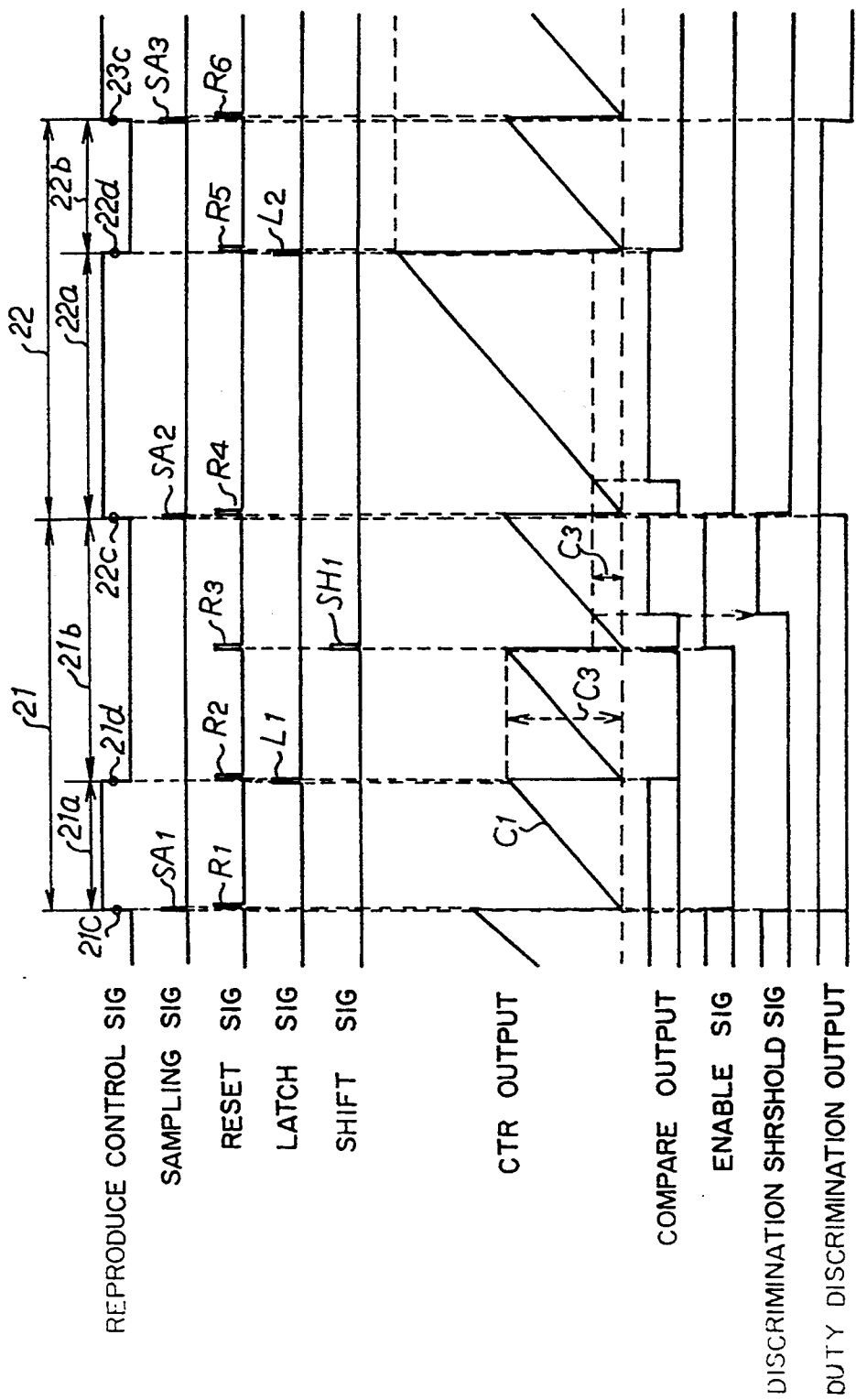
FIG. 3 is a timing chart for assistance in explaining an example of the circuit operation of the duty discriminating circuit shown in FIG. 1.

The operation of the duty discriminating circuit shown in FIG. 1 will be described hereinbelow with reference to FIG. 3. FIG. 3 shows a timing chart obtained when the video tape is rotated in the forward direction; that is, the forward/reverse rotation signal is at the high level. Under these conditions, the precedent portions 21a and 22a of the one-cycle reproduced control signals 21 and 22 are both at the high level, and the subsequent portions 21b and 22b thereof are both at the low level.

First, the duty discrimination of the reproduced control signal 21 with a duty of 27.5% will be explained.

Upon detection of a rise edge 21c of the reproduced control signal 21, the sequencer 11 outputs the sampling signal $SA_1$ and the reset signal $R_1$, and sets the enable signal to the low level.

Being reset in response to this reset signal $R_1$, the counter circuit 12 starts to count the number of the reference clock signals applied by the reference clock generating circuit (not shown).

Further, upon detection of a fall edge 21d of the reproduced control signal 21, the sequencer 11 outputs the latch signal $L_1$ and further outputs a reset signal $R_2$ being delayed by a predetermined time.

In response to the latch signal $L_1$, the latch circuit 13 latches the count value $C_1$ outputted by the counter circuit 12. Further, being reset in response to the reset signal $R_2$, the counter circuit 12 restarts to count the number of the reference clock signals.

Although the latch data $C_2$ outputted by the latch circuit 13 is inputted to the shift circuit 14, since the shift signal is not inputted to the shift circuit 14, the value $C_3$ outputted by the shift circuit 14 is the same as the latch data $C_2$ outputted by the latch circuit 13.

Here, although the output value $C_3$ of the shift circuit 14 is kept constant until the sequencer 11 outputs the succeeding latch signal, the count value $C_1$ outputted by the counter circuit 12 is incremented in sequence on the basis of the reference clock signals. Therefore, when $C_1 \geq C_3$ is obtained, the comparator circuit 15 sets the output signal $C_4$ to the high level.

When the output signal $C_4$ changes to the high level, the sequencer 11 outputs the reset signal $R_3$ and the first shift signal $SH_1$. Further, in this case, since the reproduced control signal 21 is at the low level, the enable signal is set to the high level, Therefore, the counter circuit 12 is reset by the reset signal $R_3$ to restart counting the number of the reference clock signals. Further, the output value $C_3$ of the shift circuit 14 becomes a value of $\frac{1}{4}$ of the latch data $C_2$ inputted by the latch circuit 13. Further, in this case, the output signal $C_4$ of the comparator circuit 15 is reset to the low level. Accordingly, even if the enable signal changes to the high level, the discriminate threshold signal $C_5$ outputted by the AND circuit 18 is kept at the low level.

Further, when $C_1 \geq C_3$ is obtained again, since the output signal $C_4$ of the comparator circuit 15 changes to the high level again, the discriminate threshold signal $C_5$ outputted by the AND circuit 16 changes to the high level.

Here, the period of the precedent portion (the high level) 21a is denoted by $T_H$; the period between the fall edge 21d and the time at which the first $C_1 = C_3$ is obtained is denoted by $T_{L1}$; and the period between the time at which the first $C_1 = C_3$ is obtained and the time at which the succeeding $C_1 = C_3$ is obtained is denoted by $T_{L2}$. Then, the period $T_D$ between the rise edge 21c of the precedent portion 21a and the rise edge of the discriminate threshold signal $C_5$ can be expressed as $$T_D = T_H + T_{L1} + T_{L2}$$

where $$T_H = T_{L1} = 4 \, T_{L2}.$$

In the duty discriminating circuit of the present embodiment, since the threshold value can be obtained only when the whole period of the reproduced control signal 21 and the above-mentioned period $T_D$ match with each other, the threshold value can be given as $$\frac{T_H}{T_D} = \frac{T_H}{T_H + T_{L1} + T_{L2}} = \frac{T_H}{T_H + T_H + \frac{T_H}{4}} = \frac{1}{2.25} \approx 0.444$$

In other words, when the duty is less than 44.4%, the discriminate threshold signal $C_5$ obtained when the sequencer detects a rise edge 22c of the succeeding reproduced control signal 22 becomes the high level. When the sequencer 11 detects the rise edge 22c of the succeeding reproduced control signal 22, the sample signal $SA_2$ is outputted. In response to this sampling signal $SA_2$, the data flip-flop circuit 17 changes the duty discriminate result $C_6$ to the high level. As described above, it is possible to discriminate that the duty of the reproduced control signal 21 is 27.5%.

The duty discrimination of the reproduced control signal with a duty of 60% will be explained hereinbelow.

In the same way as above, upon detection of a rise edge 22c of the reproduced control signal 22, the sequencer 11 outputs the sampling signal $SA_2$ and the reset signal $R_4$ to reset the counter circuit 12. Therefore, the counter circuit 12 starts to count the number of the reference clock signals. Further, the enable signal is set to the low level.

Further, upon detection of a fall edge 22d of the reproduced control signal 22, the sequencer 11 outputs the latch signal $L_2$ and further outputs a reset signal $R_5$ after a predetermined time.

In response to the latch signal $L_5$, the latch circuit 13 latches the count value $C_1$ outputted by the counter circuit 12. Thereafter, the counter circuit 12 resets the count value $C_1$, so that $C_1 < C_3$ can be obtained.

If this $C_1 < C_3$ is kept as it is when the sequencer 11 detects a rise edge 23c of the succeeding reproduced control signal 23, since both the inputs of the AND circuit 18 are at the low level, the discriminate threshold signal $C_5$ is at the low level. Therefore, when the sampling signal $SA_3$ is inputted, the duty discriminate result signal $C_6$ outputted by the data flip-flop circuit 17 is at the low level, so that it is possible to discriminate the duty as being 60%. Further, in this case, if $C_1 \geq C_3$ by the reason that the duty reproducibility is low, for instance, the output signal $C_4$ of the comparator circuit 15 changes to the high level. Further, in the same way as already explained, the counter circuit 12 is reset, the latch data $C_2$ is reduced down to $\frac{1}{4}$, and further the enable signal changes to the high level. However, unless $C_1 \geq C_3$, since the discriminate threshold signal $C_5$ is not set to the high level, the duty discriminate result $C_6$ is at the low level, so that the duty is discriminated as being 60%.

As described above, in the duty discriminating circuit according to the present invention, it is possible to determine the threshold value to be 44.4% when the video tape is rotating in the forward direction. Since this value is very close to the afore-mentioned ideal threshold value, it is possible to discriminate the duty more accurately.

Figure 4:
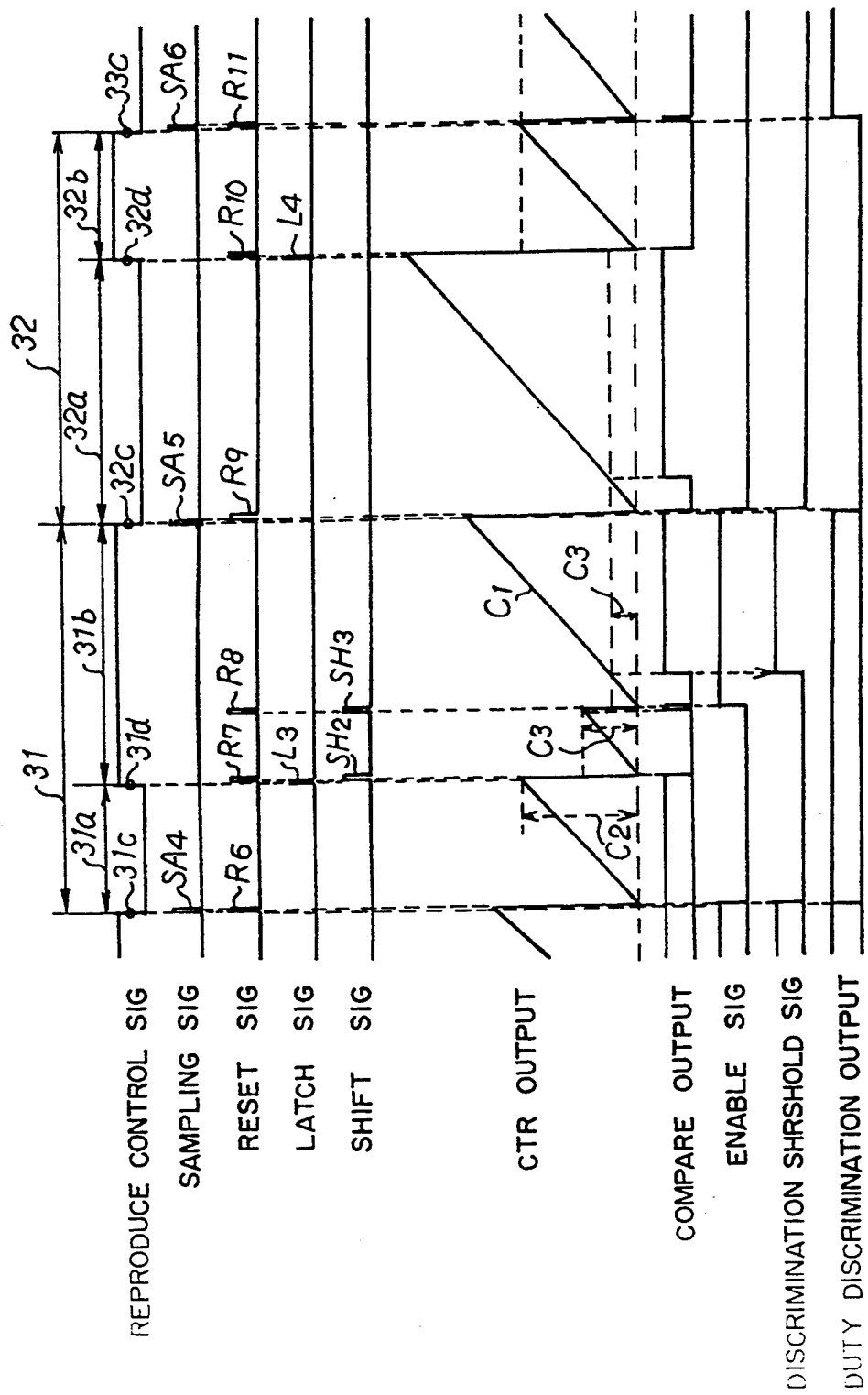
FIG. 4 is a timing chart for assistance in explaining another example of the circuit operation of the duty discriminating circuit shown in FIG. 1.

The operation of the duty discriminating circuit shown in FIG. 1 will be described hereinbelow with reference to FIG. 4. FIG. 4 shows a timing chart obtained when the video tape is rotated in the reverse direction; that is, the forward/reverse rotation signal is at the low level. Under these conditions, the precedent portions 31a and 32a of the one-cycle reproduced control signals 31 and 32 are at the low level, and the subsequent portions 31b and 32b thereof are at the high level as shown in FIG. 3.

First, the duty discrimination of the reproduced control signal 31 with a duty of 40% An the reverse direction rotation (i.e., the duty is 60% in the forward direction rotation) will be explained.

Upon detection of a fall edge 31c of the reproduced control signal 31, the sequencer 11 outputs the sampling signal $SA_4$ and the reset signal $R_6$, and sets the enable signal to the low level.

Being reset in response to this reset signal $R_6$, the counter circuit 12 is reset.

Further, upon detection of a rise edge 31d of the reproduced control signal 31, the sequencer 11 outputs the latch signal $L_3$ and further outputs a reset signal $R_7$ and the second shift signal $SH_2$ after a predetermined time.

In response to the latch signal $L_3$, the latch circuit 13 latches the count value $C_1$ outputted by the counter circuit 12. Further, at this time, the data of $\frac{1}{2}$ of the latch data $C_2$ is outputted by the shift circuit 14 as the data signal $C_3$. Further, the counter circuit 12 is reset in response to the reset signal $R_7$.

Thereafter, when the count value $C_1$ outputted by the counter circuit 12 increases and thereby $C_1 \geq C_3$ is obtained, the comparator circuit 15 sets the output signal $C_4$ to the high level.

In response to this signal $C_4$, the sequencer 11 outputs the reset signal $R_8$ and the first shift signal $SH_3$, and further sets the enable signal to the high level.

Therefore, the counter circuit 12 is reset by the reset signal $R_8$. Further, the output value $C_3$ of the shift circuit 14 becomes a value of $\frac{1}{4}$ of the latch data $C_2$ inputted by the latch circuit 13. Further, in this case, since the output signal $C_4$ of the comparator circuit 15 is at the low level, the discriminate threshold signal $C_5$ outputted by the AND circuit 16 is kept at the low level.

Further, when $C_1 \geq C_3$ is obtained again, since the output signal $C_4$ of the comparator circuit 15 changes to the high level again, the discriminate threshold signal $C_5$ outputted by the AND circuit 16 changes to the high level.

Here, when the threshold value can be obtained in the same way as with the case of the forward direction rotation as follows:

$$\frac{T_H}{T_D} = \frac{T_H}{T_H + T_{L1} + T_{L2}} = \frac{T_H}{T_H + \frac{T_H}{2} + \frac{T_H}{4}} = \frac{1}{1.75} \approx 0.571$$

In other words, where the duty is less than 57.1%, the discriminate threshold signal $C_5$ obtained when the sequencer 11 detects a fall edge 32c of the succeeding reproduced control signal 32 becomes the high level.

In response to this sampling signal $SA_5$, the data flip-flop circuit 17 changes the duty discriminate result $C_6$ to the high level. As described above, it is possible to discriminate that the duty of the reproduced control signal 31 is 40%.

The duty discrimination of the reproduced control signal 32 with a duty of 72.5% in the reverse direction rotation (i.e., the duty is 27.5% in the forward direction rotation) will be explained.

In the same way as above, upon detection of a fall edge 32c of the reproduced control signal 32, the sequencer 11 outputs the sampling signal $SA_5$ and the reset signal $R_9$ to reset the counter circuit 12. Therefore, the counter circuit 12 starts to count the number of the reference clock signals. Further, the enable signal is set to the low level.

Further, upon detection of a rise edge 32d of the reproduced control signal 32, the sequencer 11 outputs the latch signal $L_4$ and further outputs a reset signal $R_{10}$ after a predetermined time.

In response to the latch signal $L_4$, the latch circuit 13 latches the count value $C_1$ outputted bF the counter circuit 12. Thereafter, the counter circuit 12 resets the count value $C_1$, so that $C_1 < C_3$ can be obtained.

If this $C_1 < C_3$ is kept as it is when the sequencer 11 detects a rise edge 33c of the succeeding reproduced control signal 33, since both the inputs of the AND circuit 16 are at the low level, the discriminate threshold signal $C_5$ is at the low level. Therefore, the duty discriminate result signal $C_6$ outputted by the data flip-flop circuit 17 is at the low level, so that it is possible to discriminate the duty as being 72.5%. Further, in this case, if $C_1 24 C_3$ by the reason that the duty reproducibility is low, for instance, the output signal $C_4$ of the comparator circuit 15 changes to the high level. Further, in the same way as already explained, the counter circuit 12 is reset, the latch data $C_2$ becomes $\frac{1}{4}$, and further the enable signal changes to the high level. In this case ,however, since the discriminate threshold signal $C_5$ not be changed to the high level as far as the third $C_1 \geq C_3$ is not obtained, the duty discriminate result $C_6$ is at the low level, with the result that the duty is discriminated as being 72.5%.

As described above,.in the duty discriminating circuit according to the present invention, it is possible to determine the threshold value to be 57.1% when the video tape is rotating in the reverse direction. Since this value is very close to the afore-mentioned ideal threshold value, it is possible to discriminate the duty more accurately.

A modification of the first embodiment of the duty discriminating circuit according to the present invention shown in FIG. 1 will be described hereinbelow with reference to a timing chart shown in FIG. 5. In this modification, the discriminating circuit is controlled by the sequencer 11 under a sequence control different from that described with reference to the timing charts shown in FIGS. 3 and 4.

Figure 5:
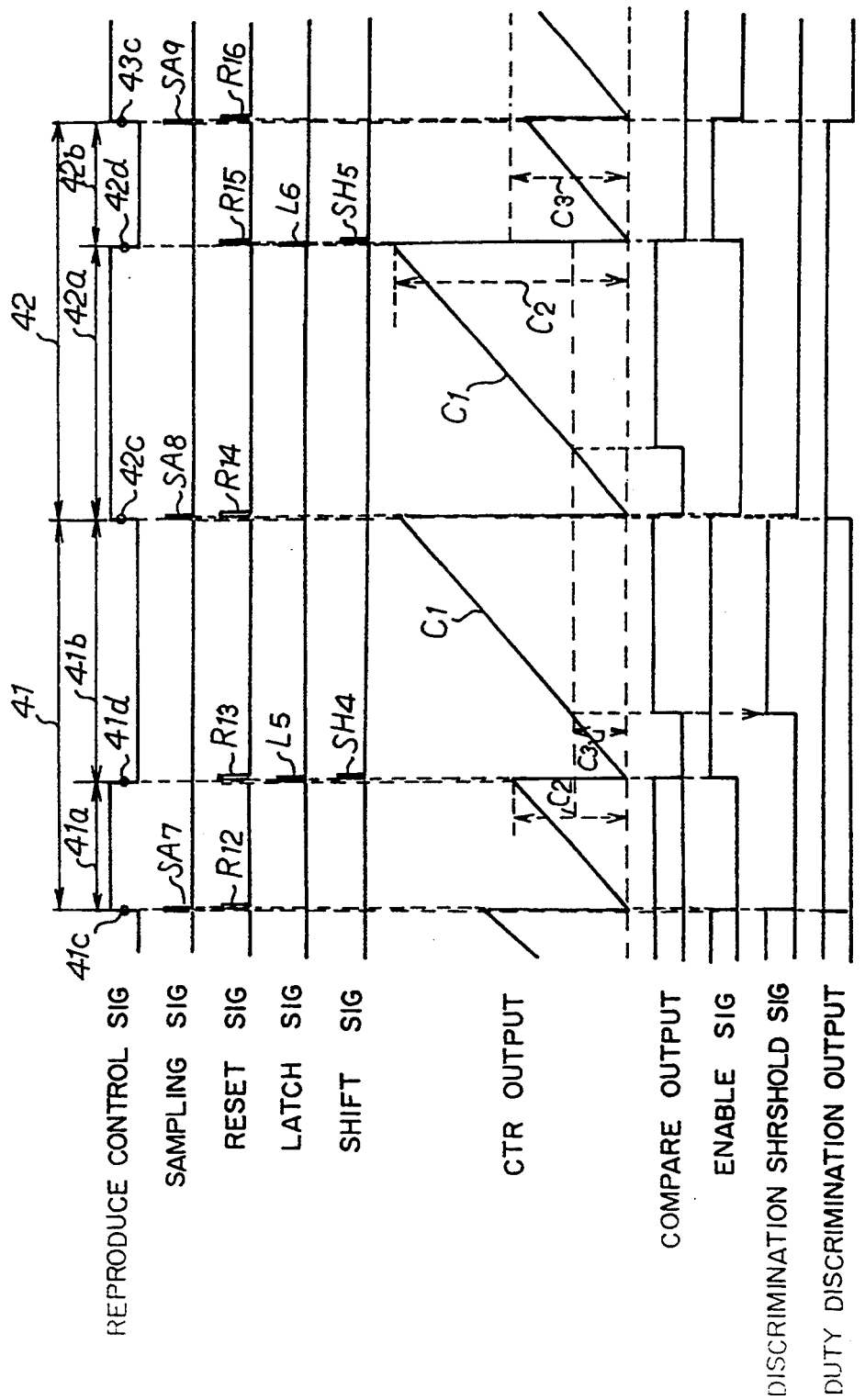
FIG. 5 is a timing chart for assistance in explaining an example of the circuit operation of a modification of the first embodiment of the duty discriminating circuit according to the present invention.

In FIG. 5, the precedent portions 41a and 42a of the one-cycle reproduced control signals 41 and 42 are determined to be the high level, and the subsequent portions 41b and 42b thereof are determined to be at the low level.

In this modification, although the circuit configuration is quite the same as with the case as shown in FIG. 1, the sequencer 11 is constructed as follows: upon detection of a rise edge of the reproduced control signal, the sequencer 11 outputs the sampling signal and the reset signal and further changes the enable signal to the low level. Further, upon detection of a fall edge of the reproduced control signal, the sequencer 11 outputs the reset signal, the latch signal and the shift signal for reducing the latch data down to $\frac{1}{2}$ and further changes the enable signal to the high level. The constructions of the respective circuit elements 12 to 17 other than the sequencer 11 are quite the same as the duty discriminating circuit shown in FIG. 1.

The operation of the duty discriminating circuit of this modification will be described hereinbelow.

First, upon detection of a rise edge 41c of the reproduced control signal 41., the sequencer 11 outputs the sampling signal $SH_7$ and the reset signal $R_{12}$, and sets the enable signal to the low level.

Being reset in response to this reset signal $R_{12}$, the counter circuit 12 starts to count the number of the reference clock signals.

Further, upon detection of a fall edge 41d of the reproduced control signal 41, the sequencer 11 outputs the latch signal $L_5$ and further outputs a reset signal $R_{13}$ and the shift signal $SH_4$ after a predetermined time. Further, the sequencer 11 changes the enable signal to the high level.

In response to the latch signal $L_5$, the latch circuit 13 latches the count value $C_1$ outputted by the counter circuit 12. Further, the shift circuit 14 reduces the latch data $C_2$ inputted by the latch circuit 13 down to $\frac{1}{2}$ and outputs this reduced data as an output signal $C_3$. As described above, on the basis of the shift signal $SH_4$ and the high-level enable signal, the count value $C_1$ obtained when the succeeding latch data becomes $\frac{1}{2}$ is determined to be the threshold value.

Further, being reset in response to the reset signal $R_{13}$, the counter circuit 12 restarts to count the reference clock signals.

Here, the period of the precedent high-level portion 41a is denoted by $T_H$, and the period between the start of the subsequent low-level portion 41b and the time at which $C_1 = C_3$ is obtained is denoted by $T_L$. Then, the period $T_D$ between the rise edge of the precedent high-level portion 41a and the time at which $C_1 = C_3$ is obtained can be expressed as $$T_D = T_H + T_L.$$

Further, since $T_H = 2 T_L$, the threshold value can be expressed as $$\frac{T_H}{T_D} = \frac{T_H}{T_H + T_L} = \frac{T_H}{T_H + \frac{T_H}{2}} = \frac{1}{1.5} \approx 0.667$$

That is, in the case where the duty is less than 66.7%, since $C_1 \geq C_3$ can be obtained before the rise edge 42c of the succeeding reproduced control signal 42, the output signal $C_4$ of the comparator circuit 15 changes to the high level. At this time, since the enable signal is at the high level, the discriminate threshold signal $C_5$ is at the high level. Further, the data flip-flop circuit 17 changes the duty discriminate result $C_6$ to the high level in accordance with the sampling signal $SA_2$ outputted when the sequencer 11 detects the rise edge 42c of the succeeding reproduced control signal 42.

As described above, it is possible to discriminate the duty of the reproduced control signal 41 to be smaller than 66.7%.

On the other hand, with respect to the succeeding reproduced control signal 42, in the same way as with the case of the above-mentioned reproduced control signal 41, the sequencer 11 outputs the reset signal $R_{14}$ (and the sampling signal $SA_8$ simultaneously) and further changes the enable signal to the low level on the basis of the rise edge 42c of the reproduced control signal 42. Successively, the sequencer 11 outputs the latch signal $L_6$, the reset signal $R_{15}$, and the shift signal $SH_5$ and further changes the enable signal to the high level on the basis of the fall edge 42d of the reproduced control signal 42.

Here, since the duty of the reproduced control signal 42 is larger than 66.7%, $C_1 < C_3$ can be obtained at the rise edge of the succeeding reproduced control signal 42, so that the output signal $C_4$ of the comparator circuit 15 changes to the low level. Accordingly, the discriminate threshold signal $C_5$ is at the low level, so that the duty discriminate result $C_6$ is also at the low level.

As described above, it is possible to discriminate that the duty of the reproduced control signal 42 is more than 67.7%.

As described above, in this modification of the first embodiment of the duty discriminating circuit, it is possible to obtain a threshold value different from the first embodiment as explained with reference to FIGS. 3 and 4, without changing the reference clock signal.

Figure 6:
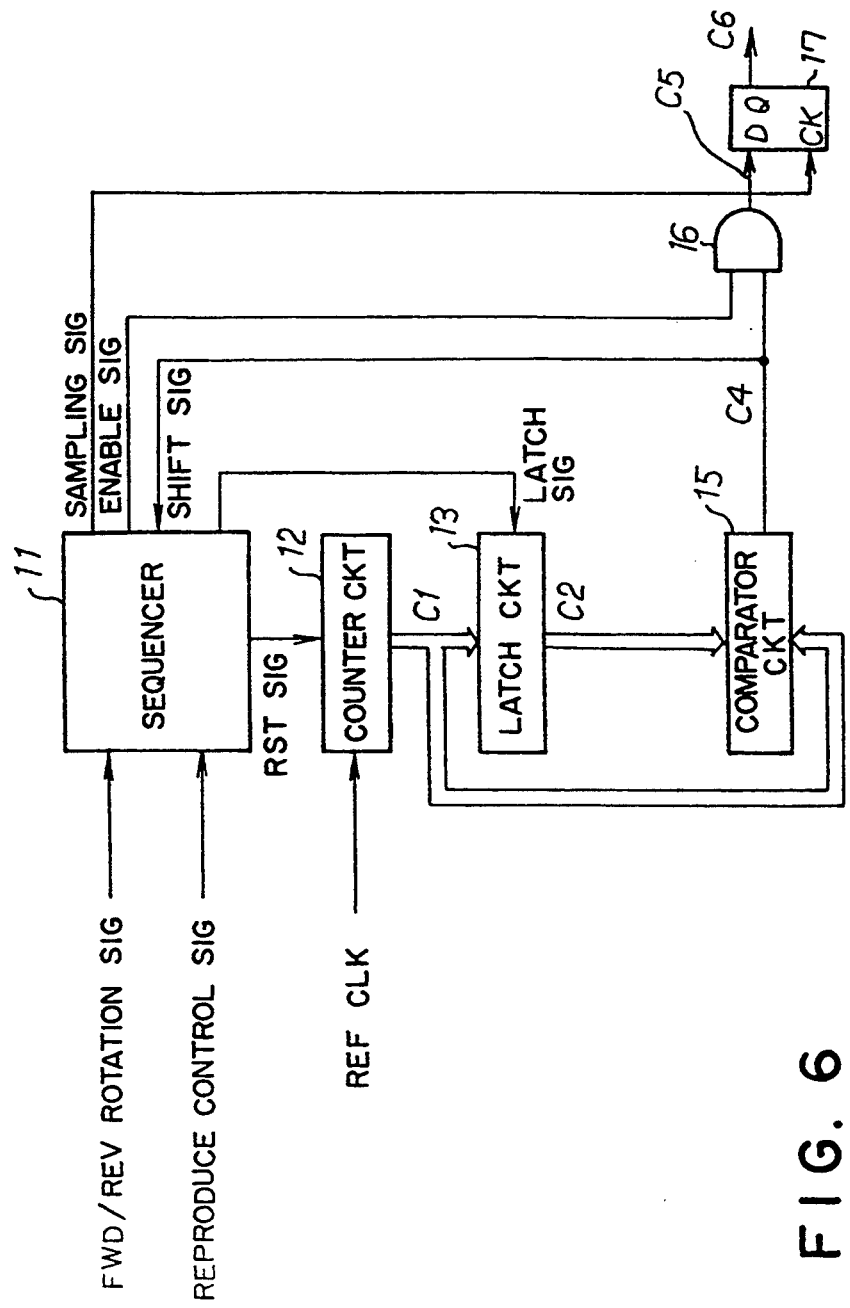
FIG. 6 is a block diagram showing a second embodiment of the duty discriminating circuit according to the present invention.

A second embodiment of the duty discriminating circuit according to the present invention will be described hereinbelow with reference to FIG. 6. This duty discriminating circuit is different from the circuit shown in FIG. 1 in that no shift circuit is provided. Therefore, the shift signal is not outputted from the sequencer 11.

Figure 8:
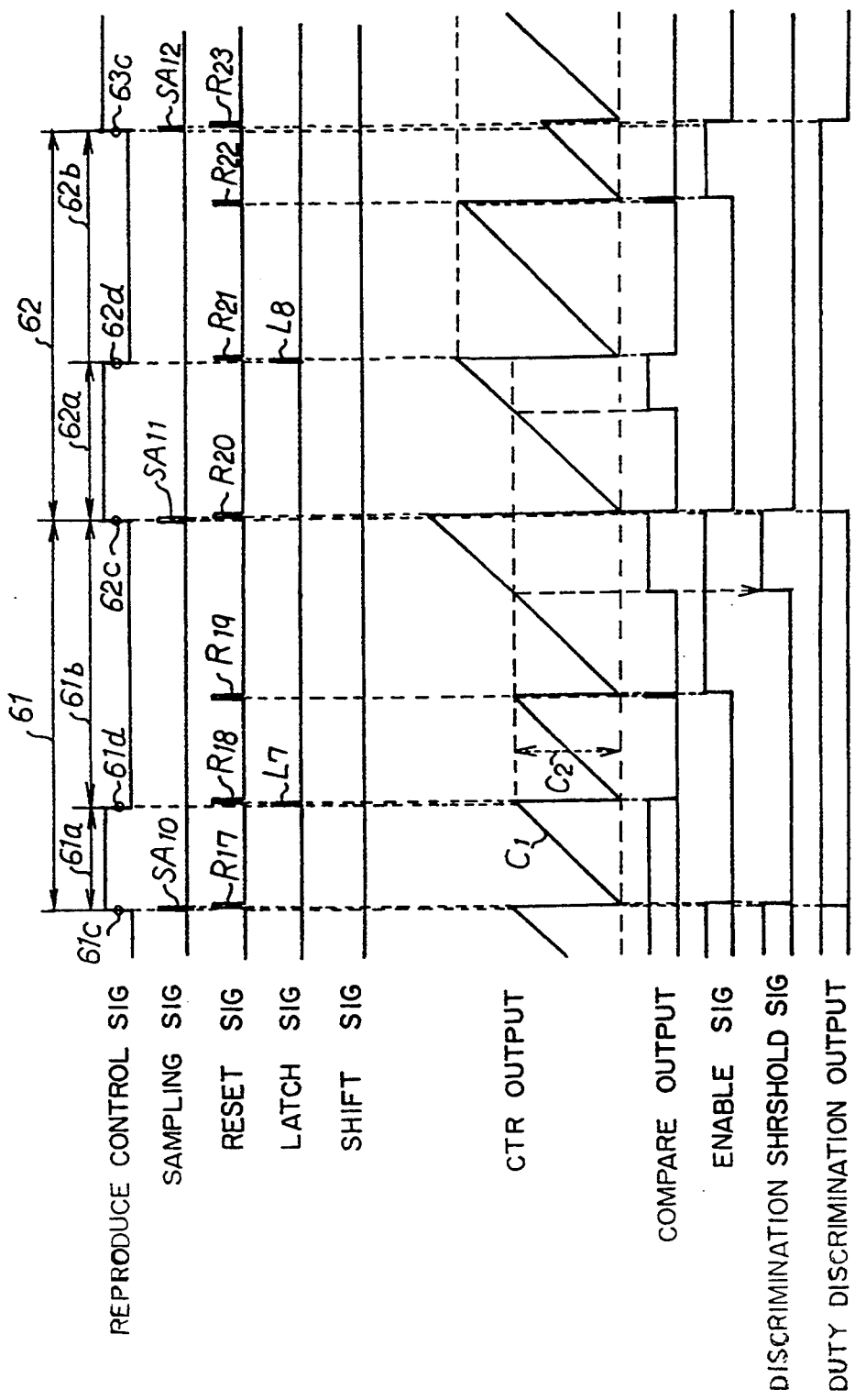
FIG. 8 is a timing chart for assistance in explaining an example of the circuit operation of the duty discriminating circuit shown in FIG. 6.

The operation of this duty discriminating circuit shown in FIG. 6 will be described with reference to a timing chart shown in FIG. 8, in which the precedent portions 61a and 62a of the one-cycle reproduced control signals 61 and 62 are determined to be at the high level and the subsequent portions 61b and 62b of the one-cycle reproduced control signals 61 and 62 are determined to be at the low level, respectively.

In the second embodiment, the sequencer 11 is constructed as follows: upon detection of a rise edge of the reproduced control signal, the sequencer 11 outputs the sampling signal and the reset signal and further changes the enable signal to the low level.

Figure 7:
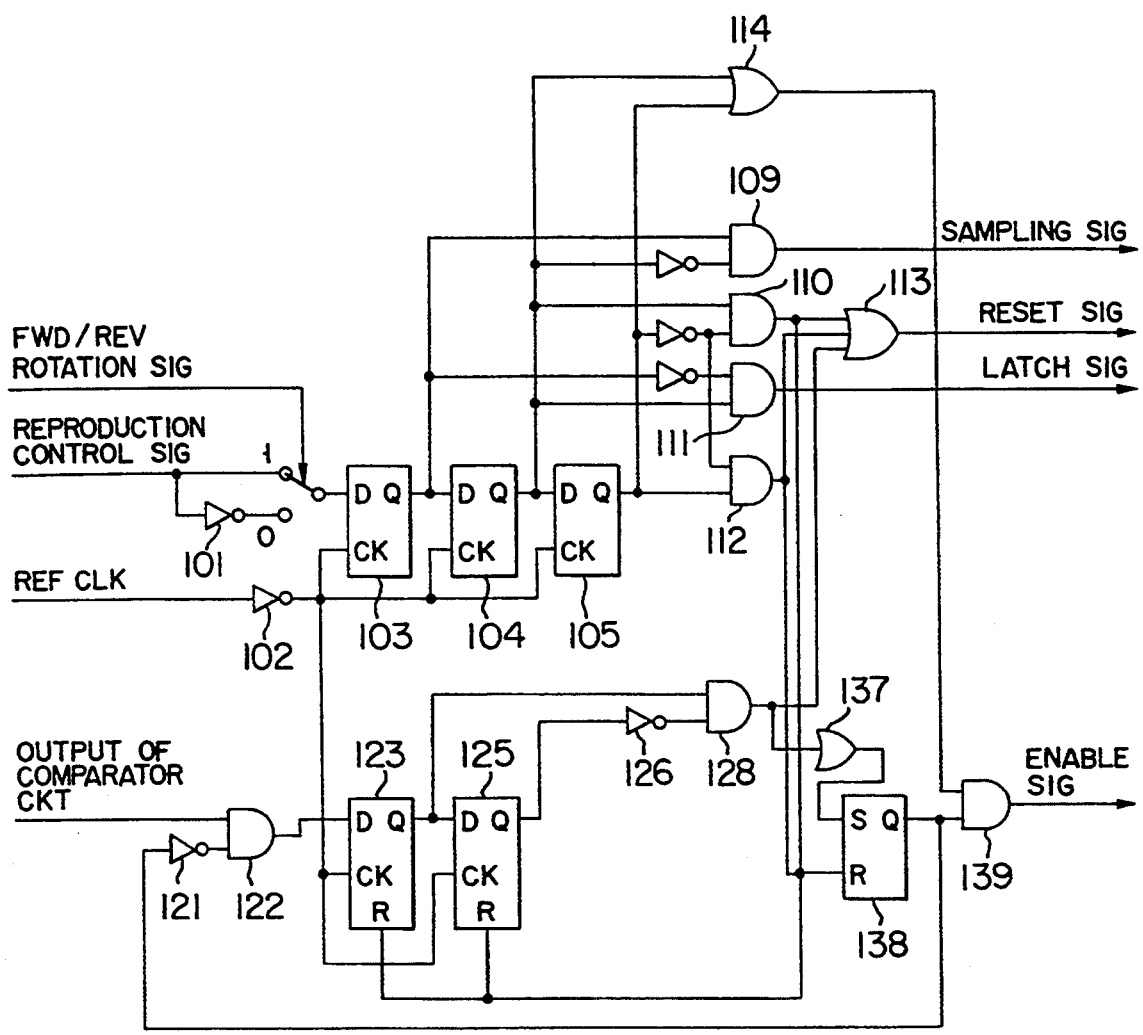
FIG. 7 is a block diagram showing a detailed configuration of the sequencer shown in FIG. 6.

FIG. 7 is a circuit diagram showing a sequencer having no shift circuit as described above. In this circuit, since no shift signal is required to be outputted, the circuit can be considerably simplified. In FIG. 7, the same reference numerals have been retained for similar circuit elements which have the same functions as with the case of that shown in FIG. 2, without repeating any detailed description thereof.

Further, upon detection of a fall edge of the reproduced control signal, the sequencer 11 outputs the reset signal and the latch signal in sequence, and further outputs the reset signal when $C_1 \geq C_2$ and changes the enable signal to the low level.

The constructions of the respective circuit elements 12, 13 and 15 to 17 are quite the same as with the case of the duty discriminating circuit shown in FIG. 1.

The operation of the duty discriminating circuit of this second embodiment will be described hereinbelow with reference to FIG. 8.

First, upon detection of a rise edge 61c of the reproduced control signal 61, the sequencer 11 outputs the sampling signal $SA_{10}$ and the reset signal $R_{17}$, and sets the enable signal to the low level.

Being reset in response to this reset signal $R_{17}$, the counter circuit 12 starts to count the number of the reference clock signals.

Further, upon detection of a fall edge 61d of the reproduced control signal 61, the sequencer 11 outputs first the latch signal $L_7$ and further outputs a reset signal $R_{18}$ after a predetermined time.

In response to the latch signal $L_7$, the latch circuit 13 latches the count value $C_1$ outputted by the counter circuit 12 and outputs the latched count value $C_1$. Further, being reset in response to the reset signal $R_{18}$, the counter circuit 12 restarts to count the reference clock signals.

Thereafter, when the count value $C_1$ outputted by the counter circuit 12 is incremented up to $C_1 \geq C_2$, the comparator circuit 15 changes the output signal $C_4$ to the high level.

When the signal $C_4$ changes to the high level, the sequencer 11 outputs the reset signal $R_{19}$ and changes the enable signal to the high level. Further, in this case, since the reproduced control signal 61 is at the low level, the enable signal is set to the high level.

Therefore, the counter circuit 12 is reset by the reset signal $R_{19}$ to restart counting the number of the reference clock signals. Further, in this case, the output signal $C_4$ of the comparator circuit 15 is set to the low level again. Accordingly, even if the enable signal changes to the high level, the discriminate threshold signal $C_5$ outputted by the AND circuit 16 is kept at the low level.

Here, the period of the precedent high-level portion 61a is denoted by $T_H$; the period between the start of the subsequent low-level portion 61b and the time at which $C_1 = C_3$ is obtained is denoted by $T_{L1}$; and the period between the reset in response to the reset signal $R_{18}$ and the time at which the succeeding $C_1 = C_3$ can be obtained is denoted by $T_{L2}$. Then, the period $T_D$ between the rise edge 61c of the precedent portion 61a and the time at which the Second $C_1 = C_3$ is obtained can be expressed as $$T_D = T_H + T_{L1} + T_{L2}$$

Further, since $T_H = T_{L1} = T_{L2}$, the threshold value can be expressed as $$\frac{T_H}{T_D} = \frac{T_H}{T_H + T_{L1} + T_{L2}} = \frac{T_H}{T_H + T_H + T_H} = \frac{1}{3} \approx 0.333$$

That is, in the case where the duty is less than 33.3%, since $C_1 \geq C_3$ can be obtained before the rise edge 62c of the succeeding reproduced control signal 62, the output signal $C_4$ of the comparator circuit 15 changes to the high level. At this time, since the enable signal is at the high level, the discriminate threshold signal $C_5$ is at the high level. Accordingly, the data flip-flop circuit 17 changes the duty discriminate result $C_8$ to the high level in accordance with the sampling signal $SA_{11}$ outputted when the sequencer 11 detects the rise edge 62c of the succeeding reproduced control signal 62.

As described above, it is possible to discriminate the duty of the reproduced control signal 61 to be smaller than 33.3%.

On the other hand, with respect to the succeeding reproduced control signal 62, in the same way as with the case of the above-mentioned reproduced control signal 61, the sequencer 11 outputs the reset signal $R_{20}$ (and the sampling signal $SA_{11}$ simultaneously) and further changes the enable signal to the low level on the basis of the rise edge 62c of the reproduced control signal 63. Successively, the sequencer 11 outputs the the latch signal $L_8$ and the reset signal $R_{21}$ on the basis of the fall edge 62d of the reproduced control signal 62. Further, when the count value $C_1$ outputted by the counter circuit 12 is incremented and therefore $C_1 < C_3$ can be obtained, the sequencer 11 outputs the reset signal $R_{22}$ to reset the count value $C_1$ and further changes the enable signal to the high level.

Here, since the duty of the reproduced control signal 62 is more than 33.3%, $C_1 < C_3$ can be obtained at the rise edge 63c of the succeeding reproduced control signal 63, so that the output signal $C_4$ of the comparator circuit 15 changes to the low level. Accordingly, the discriminate threshold signal $C_5$ changes to the low level, so that the duty discriminate result $C_6$ is also at the low level.

As described above, it is possible to discriminate that the duty of the reproduced control signal 62 is more than 33.3%.

Further, in the duty discriminating circuit shown in FIG. 1, it is of course possible to discriminate the duty in the same way as with the case of the second embodiment by executing the same sequence control as above (i.e. without use of the shift circuit 14 and with the multiplying factor kept at 1). This is because it is possible to consider that the shift circuit 14 serves to shift the latch data so that the latch data is multiplied by $2^{-n}$ times (n: zero or a natural number) in response to the shift signal.

As described above, in the second embodiment of the duty discriminating circuit according to the present invention, it is possible to obtain a threshold value different from the first embodiment, by use of the same reference clock signal as with the case of the first embodiment.

What is claimed is:

1. A duty ratio discriminating circuit for discriminating a ratio of a high-level precedent portion to one period of an information signal whose level varies periodically, on the basis of threshold values, which comprises:
   a sequencer for outputting a shift signal to obtain a first threshold level, by detecting the precedent portion of the information signal to output a sampling signal, detecting a subsequent portion of the information signal to output a latch signal, and detecting both the precedent and subsequent portions of the information siqnal to output a reset signal;
   a counter circuit, having its count data reset in response to said reset signal for detecting a time period of the precedent portion of the information signal by counting a number of reference clock signals to obtain count data;
   a shift circuit for shifting the count data;
   a discriminating circuit for obtaining a discriminate point by comparing a time period of the subsequent portion of the information signal with a second threshold value corresponding to the count data shifted by said shift circuit; and
   an output circuit for outputting a duty ratio discriminate signal on the basis of a relationship between the discriminate point outputted by said discriminating circuit and the subsequent portion time data.

2. The duty ratio discriminating circuit of claim 1, wherein said shift circuit shifts the precedent portion time data by $(2-n)$ times (where n denotes zero or a natural number) in bit unit to obtain a shifted data and outputs the shifted data.

3. A duty ratio discriminating circuit for discriminating a ratio of a high-level precedent portion to one period of an information signal whose level varies periodically, on the basis of threshold values, which comprises:
   a sequencer for outputting a shift signal to obtain a first threshold level, by detecting the precedent portion of the information signal to output a sampling signal, detecting a subsequent portion of the information signal to output a latch signal, and detecting both the precedent and subsequent portions of the information signal to output a reset signal,
   a counter circuit reset in response to the reset signal, for counting reference clock signals;
   a latch circuit for latching count data counted as a precedent portion time period data by said counter circuit in response to the latch signal;
   a shift circuit for shifting the count data latched by said latch circuit by $(2-n)$ times (where n denotes zero or a natural number) in bit unit on the basis of the shift signal outputted by said sequencer, and for outputting the shifted counted data;
   a comparator circuit for comparing the count data outputted by said counter circuit with a second threshold value corresponding to the shifted count data outputted by said shift circuit and for outputting a comparison result signal when the count data is larger than the shifted count data; and
   an output circuit for outputting the comparison result signal as a discriminate result signal on the basis of a level of the information signal and the sampling signal.

4. The duty ratio discriminating circuit of claim 3, wherein said output circuit outputs the comparison result signal of the information signal inputted in a preceding cycle at an input of said sampling signal.

5. The duty ratio discriminating circuit of claim 3, further comprising means for detecting a signal indicating a proceeding direction of the information signal, and wherein when a signal indicative of a signal proceeding direction represents a reverse direction, said sequencer outputs a second shift signal at a fall edge of the precedent portion of the information signal, a desired threshold value being obtainable on the basis of a combination of shift data obtained on the basis of the shift signal and the second shift signal.

6. A duty ratio discriminating circuit for discriminating a ratio of a high-level precedent portion to one period of an information signal whose level varies periodically, on the basis of a threshold value, which comprises:

a sequencer for outputting a sampling signal by detecting the precedent portion of the information signal, for outputting a latch signal by detecting a subsequent portion of the information signal, and for outputting a reset signal by detecting both the precedent and subsequent portions of the information signal;

a counter circuit reset in response to the reset signal, for counting reference clock signals to obtain count data;

a latch circuit for latching the count data counted by said counter circuit as a precedent portion time period data in response to the latch signal to obtain a latch data;

a comparator circuit for comparing the count data outputted by said counter circuit with the latch data outputted by said latch circuit and for outputting a comparison result signal when the count data is larger than the latch data; and an output circuit for outputting the comparison result signal as a discriminate result signal on the basis of a level of the information signal and the sampling signal.

* * * * *